(12) United States Patent
Jensen et al.

(10) Patent No.: US 8,021,715 B2
(45) Date of Patent: Sep. 20, 2011

(54) COLD GAS SPRAYING METHOD

(75) Inventors: Jens Dahl Jensen, Berlin (DE); Ursus Krüger, Berlin (DE); Raymond Ullrich, Schönwalde (DE)

(73) Assignee: Siemens Aktiengesellschaft, Munich (DE)

( * ) Notice: Subject to any disclaimer, the term of this patent is extended or adjusted under 35 U.S.C. 154(b) by 1072 days.

(21) Appl. No.: 11/815,358

(22) PCT Filed: Jan. 30, 2006

(86) PCT No.: PCT/EP2006/050518
§ 371 (c)(1),
(2), (4) Date: Aug. 2, 2007

(87) PCT Pub. No.: WO2006/082170
PCT Pub. Date: Aug. 10, 2006

(65) Prior Publication Data
US 2010/0068410 A1    Mar. 18, 2010

(30) Foreign Application Priority Data

Feb. 2, 2005    (DE) .......................... 10 2005 005 359

(51) Int. Cl.
*B05D 1/02*    (2006.01)
*B05D 1/12*    (2006.01)

(52) U.S. Cl. ........ 427/189; 427/427; 427/98.4; 427/552
(58) Field of Classification Search .................. 427/555, 427/189, 98.4, 427
See application file for complete search history.

(56) References Cited

U.S. PATENT DOCUMENTS

| | | | |
|---|---|---|---|
| 4,300,474 A * | 11/1981 | Livsey | 118/641 |
| 4,724,299 A | 2/1988 | Hammeke | |
| 4,743,733 A * | 5/1988 | Mehta et al. | 219/121.66 |
| 6,197,386 B1 | 3/2001 | Beyer et al. | |
| 6,258,402 B1 | 7/2001 | Hussary et al. | |
| 6,634,179 B2 | 10/2003 | Heinemann et al. | |
| 6,803,078 B2 | 10/2004 | Haug et al. | |
| 2002/0034593 A1 | 3/2002 | Haug et al. | |

(Continued)

FOREIGN PATENT DOCUMENTS

CN    1395462 A    2/2003
(Continued)

OTHER PUBLICATIONS

German translation of Russian Office Action dated Oct. 16, 2009.
(Continued)

*Primary Examiner* — Frederick J Parker
(74) *Attorney, Agent, or Firm* — Laurence A. Greenberg; Werner H. Stemer; Ralph E. Locher

(57) ABSTRACT

A method for coating a workpiece by cold gas spraying is carried out using a cold gas spray nozzle which generates a particle jet that is directed onto the surface. Additional energy is introduced into the layer that is being formed by way of an electromagnetic energy source, e.g. a laser, which the energy introduced into the particles by the cold gas spray nozzle also contributes to forming the layer. The cold spraying process can be used flexibly as a result of the additional activation by way of electromagnetic radiation. Moreover, layers having a complicated structure, e.g. strip conductors, can be created with the aid of the laser without further processing. A coating unit includes a generator for electromagnetic radiation in addition to the cold gas spray nozzle and is therefore suitable for carrying out the novel method.

5 Claims, 2 Drawing Sheets

U.S. PATENT DOCUMENTS

Figure 1:
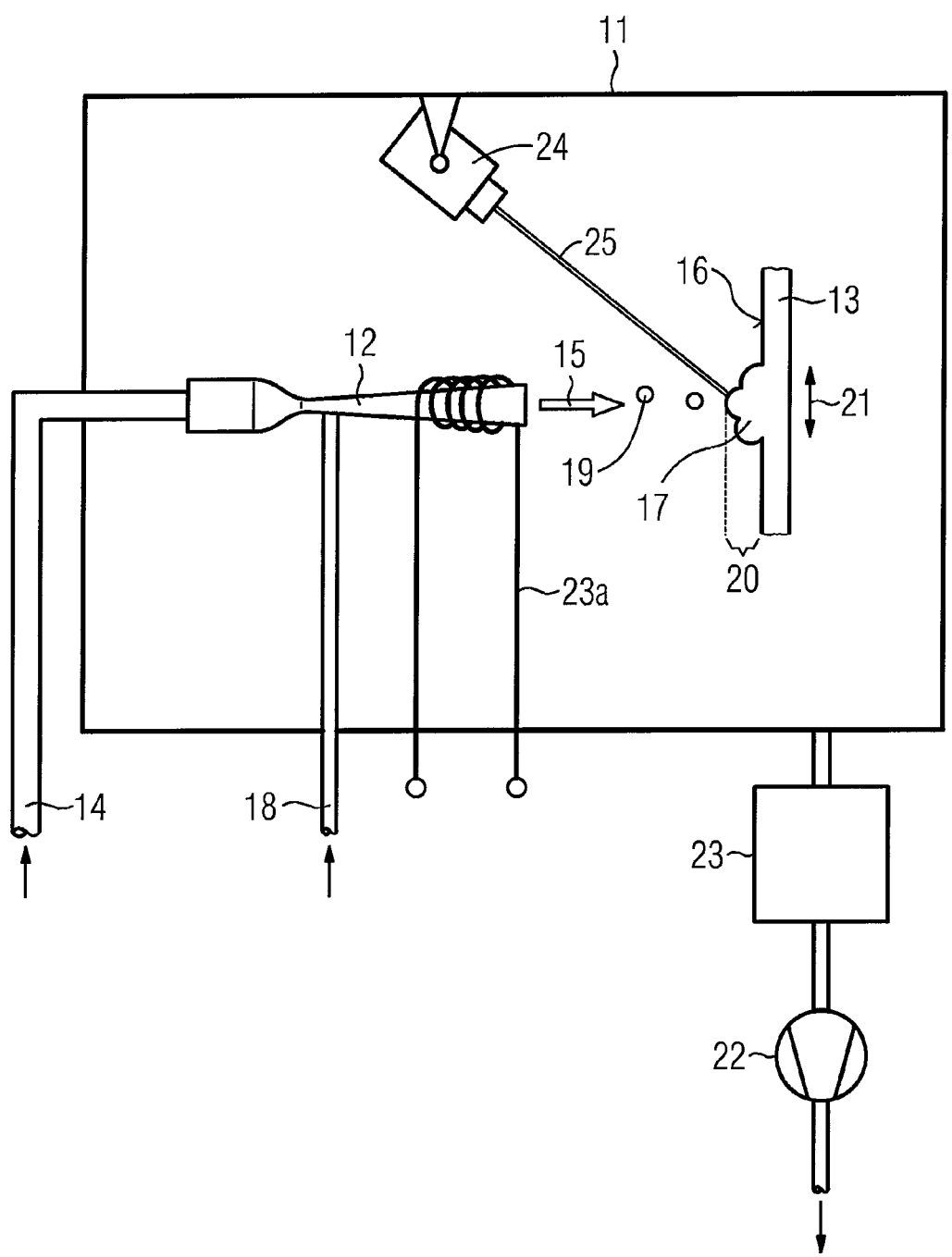

| | | | |
|---|---|---|---|
| 2003/0219576 A1* | 11/2003 | Elmoursi et al. | 428/210 |
| 2004/0037954 A1 | 2/2004 | Heinrich et al. | |
| 2004/0126499 A1 | 7/2004 | Heinrich et al. | |
| 2006/0133947 A1* | 6/2006 | DeBiccari et al. | 419/8 |

FOREIGN PATENT DOCUMENTS

| | | |
|---|---|---|
| CN | 2584340 Y | 11/2003 |
| DE | 199 41 562 A1 | 8/2000 |
| DE | 100 36 264 A1 | 2/2002 |
| DE | 600 09 823 T2 | 8/2004 |
| DE | 197 40 205 B2 | 11/2004 |
| EP | 1 092 497 A1 | 4/2001 |
| EP | 1 382 719 A2 | 1/2004 |
| EP | 1 382 719 A3 | 12/2005 |
| EP | 1 622 435 A1 | 2/2006 |
| JP | 05078812 A | 3/1993 |
| JP | 2000119835 | 4/2000 |
| WO | 03/039407 A2 | 5/2003 |
| WO | 03039407 * | 5/2003 |
| WO | 03/070524 A1 | 8/2003 |

OTHER PUBLICATIONS

Fengyun Zhou, "Engineering materials and application", Huazhong University of Science and Technology Press, First Edition, Oct. 31, 1999, pp. 252-253—Statement of Relevance.

* cited by examiner

COLD GAS SPRAYING METHOD

BACKGROUND OF THE INVENTION

Field of the Invention

The invention relates to a method for coating a workpiece in which particles of a coating material are accelerated by means of a cold gas spray nozzle toward the surface of the workpiece that is to be coated.

A method of this type is described for example in US 2004/0037954 A1. According to this method, the particles that are intended to form the coating are accelerated toward the surface of the component that is to be coated in what is known as a cold gas jet. This is performed by means of a cold gas spray nozzle. In this case, the coating particles are subjected to sufficient kinetic energy for a layer to be created on the surface that is to be coated. In this case, on the one hand the kinetic energy is converted into a deformation of the coating particles and the surface, on the other hand a conversion of the kinetic energy into thermal energy leads to melting of the surface of the workpiece and of the coating particles, at least in the regions near the surface, so that the coating forms a firmly adhering structure on the surface of the workpiece that is to be coated.

The method described is also referred to as cold gas spraying. The use of this method has the advantage that the thermal loading of the coating particles and of the substrate can be kept low in comparison with plasma spraying, for example, so that the microstructure of the coating particles is influenced less or not at all. This allows coating particles with special properties to be used for the production of layers, without the properties of the coating particles being impaired as a result of thermal loading of the same.

According to DE 600 09 823 T2, a method for repairing surfaces by means of cold gas spraying is described. The locations of the surface that are to be repaired are treated with a cold gas jet containing the coating particles, whereby a layer forms. The energy introduced into the cold gas jet can be increased if the coating particles are exposed to a radiation source, for example a laser. This increases the thermal energy of the coating particles, which do not undergo any significant increase in temperature as a result of the acceleration in the cold gas spray nozzle. Furthermore, the layer formed can be subjected to a subsequent treatment, which may likewise be performed by means of a laser.

According to the abstract of JP 05078812A, it is provided that a layer can be produced by thermal spraying and can be subsequently treated by means of a laser, in order to produce the final composition of the layer. Similarly, according to DE 199 41 562 A1, a coating can be produced for example as a running surface for cylinders, which is produced as a thermally sprayed layer and is subsequently re-melted by means of a laser beam, whereby the desired microstructural composition is created.

According to DE 197 40 205 B4, it is also possible in the case of plasma spraying to slow the cooling of the coating applied by the plasma spraying by means of a laser, in order to influence the formation of the microstructure of the coating directly. For this purpose, the applied particles of the spray jet are kept at melting temperature for a time.

SUMMARY OF THE INVENTION

The object of the invention is to improve a method for coating workpieces by means of a cold gas spray nozzle to the extent that greatest possible freedom in the production of the layers is obtained by this method.

This object is achieved according to the invention with the method mentioned at the beginning by the particles in the cold gas jet being subjected to an amount of energy that is too small to cause permanent adherence of the particles on the surface and by permanent adherence of the particles being produced during the coating by locally introducing electromagnetic radiation into the point of impingement of the cold gas jet on the surface. In the case of the refinement of the method according to the invention, the cold gas spray nozzle is therefore operated with process parameters deliberately chosen such that the cold gas spraying alone does not produce a coating with properties that already correspond to the desired end product of the coating. In other words, the energy introduced by the cold gas spraying is not adequate to produce the desired layer. According to the invention, therefore, a further energy source is provided, permitting electromagnetic radiation to be introduced locally into the surface, to be more precise in the region of the coating for which the properties can be finally produced by the additional introduction of energy provided by the electromagnetic radiation. This advantageously makes it possible to keep the energy introduced by the cold gas spray nozzle comparatively low, so that particles with a comparatively low melting point can be used for the coating. Furthermore, it is possible by the local introduction of energy provided by the electromagnetic radiation on the surface of the coated workpiece to produce layers with locally changing properties, dependent on the amount of energy that is introduced locally. It is advantageous in this respect that high accuracy can be obtained in the local changing of the property of the layer.

According to a refinement of the method, it is provided that the amount of energy in the cold gas jet is great enough to cause temporary adherence of the particles, the local production of permanent adherence of certain particles being followed by the remaining, temporarily adhering particles being removed again from the surface. Temporary adherence of the particles can be achieved by their kinetic energy being just adequate for the coating particles to adhere on the surface. The introduction of energy necessary for this can be set very accurately by the cold gas spraying method that is used. On the other hand, the adherence of the particles is not great enough for possible melting of the workpiece and the particles to take place. As a result, the temporarily adhering particles can be removed again from the surface, essentially involving a separation between the boundary surfaces of the workpiece and of the particles (for example mechanically, by sand blasting or laser ablation). However, permanent adherence of the particles intended for this can be achieved locally by the additional introduction of energy. This is so because the introduction of energy leads to a final dissolution of the boundary surfaces between the particles concerned and the surface, or else between the boundary surfaces of neighboring particles, so that they can no longer be separated from one another. In this case, for example, the regions of the workpiece and the particles that are near the boundary surface are melted, so that a unitary microstructure is created after solidification.

According to another refinement of the method, it is provided that the amount of energy in the cold gas jet is too small to cause any adherence of the particles on the surface, and the local introduction of energy provided by electromagnetic radiation, producing permanent adherence, is performed simultaneously with the impingement of the particles on the surface. While in the case of the method for producing temporary adherence of the particles the energy of the electromagnetic radiation can optionally be introduced simultaneously with the coating or after completion of the coating operation, in the case where the amount of energy in the cold gas jet is not adequate to cause adherence of the particles on the surface it is necessary for the additional activation by the electromagnetic radiation to take place simultaneously, to make it possible in the first place for a layer to build up. Otherwise, the coating particles would rebound from the surface without the build-up of a layer taking place (comparable with the effect of sand blasting). The local introduction of energy, however, advantageously makes it possible for a layer to build up with high local accuracy. The layer may in this case be built up as a single layer or a number of layers, it being possible for any desired geometrical structures to be produced already during the build-up of the layer, without further processing being required.

A feature that is common to the refinements of the method according to the invention that have been described is that the introduction of energy into the particles that is necessary for production of the layer is divided, much of it on the one hand being accounted for by the cold gas spray nozzle and some of it on the other hand being accounted for by the energy source for the electromagnetic radiation (for example a laser). In this way, the method according to the invention advantageously creates great freedom in changing the process parameters. On the one hand, alignment of the cold gas spray nozzle allows relatively accurate alignment of the particle jet on the surface of the workpiece, on the other hand the energy source for the electromagnetic radiation can be very accurately aligned independently of the cold gas spray nozzle, so that the build-up of a layer with highly accurate geometry is made possible.

Although it is known in principle, for example from U.S. Pat. No. 4,724,299, to use electromagnetic radiation to melt coating particles in what are known as laser cladding methods, in the case of this process the introduction of energy intended for the build-up of a layer is performed exclusively by the laser beam, since the kinetic energy of the particles caused by the particle feed can be ignored. This is merely intended to ensure that the coating particles are uniformly transported. This also explains the ring structure of the feeding device for the coating particles that is used as standard in the case of laser cladding methods, since the laser is intended to be produced at the center and feeding of the particles must take place very close to the focal point of the laser on account of their low kinetic energy.

According to an additional refinement of the method, it is provided that the amount of energy to which the particles are subjected comprises not only an amount of kinetic energy, produced by their acceleration in the cold gas spray nozzle, but also an amount of thermal energy, produced by an additional energy source in the cold gas jet. A certain heating of the particles in the cold gas spray nozzle below the melting temperature of the particles leads to a reduction in the energy that has to be introduced by the electromagnetic radiation. This advantageously creates a further process parameter by means of which the build-up of a layer can be influenced.

It is particularly advantageous if an electrically insulating workpiece is used and electrically conductive strip conductors are produced from the particles on the workpiece with the electromagnetic radiation. In this way, it is advantageously possible for example to produce strip conductors for electronic circuit components with complex geometry on non-conducting surfaces. The particles used may, for example, contain electrically conductive material, which is only activated by the treatment by means of the electromagnetic radiation, whereby the conductivity is produced. In addition, the electrically conductive regions of the coating may, for example, be galvanically coated to improve the electrical properties, since they provide an electrically conductive base for this.

Furthermore, it is advantageous to use a laser for producing the electromagnetic radiation. This makes it possible for electromagnetic radiation to be introduced very locally into the layer that is to be formed. This is also possible in the case of complex surface geometries of the component that is to be coated.

Further details of the invention are described below on the basis of the drawing. In the individual figures, the same or corresponding components are provided in each case with the same designations and are only explained more than once wherever differences arise between the individual figures. In the drawing:

BRIEF DESCRIPITIONS OF SEVERAL VEIWS OF THE DRAWING

Figure 2:
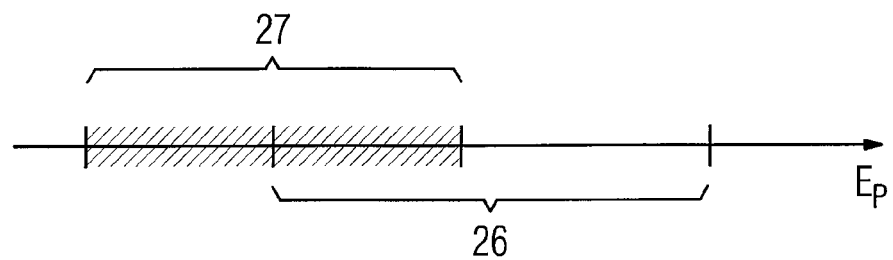
Figure 3:
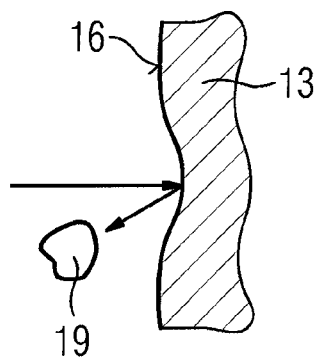
Figure 4:
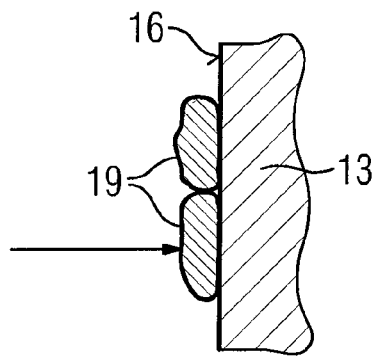
Figure 5:
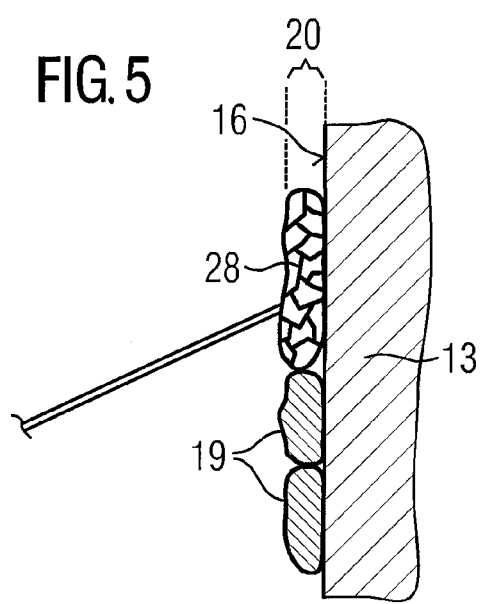

FIG. 1 shows an exemplary embodiment of the coating unit according to the invention as a schematic drawing, FIG. 2 shows the region where the particles are subjected to energy in the method according to the invention, in comparison with the region that is used in the case of cold gas spraying according to the prior art, in qualitative terms, and FIGS. 3 to 5 shows selected method steps of exemplary embodiments of the method according to the invention in which the particles do not adhere on the surface, temporarily adhere or finally adhere as a result of the treatment with a laser.

DESCRIPITION OF THE INVENTION

Represented in FIG. 1 is a modified apparatus for cold gas spraying. This has a vacuum chamber 11, in which on the one hand a cold gas spray nozzle 12 and on the other hand a workpiece 13 are arranged (fastening not shown any more specifically). A process gas can be fed through a first line 14 to the cold gas spray nozzle 12. As indicated by the contour, this nozzle is formed as a Laval nozzle, by which the process gas is made to expand and is accelerated in the form of a gas jet (arrow 15) toward a surface 16 of the substrate 13. The process gas may contain oxygen 17 as a reactive gas. Furthermore, the process gas may be heated in a way not represented, whereby a required process temperature is established in the vacuum chamber 12.

Particles 19, which are accelerated in the gas jet and impinge on the surface 16, may be fed through a second line 18 to the cold gas spray nozzle 12. The kinetic energy of the particles leads to adhering of the same on the surface 16, the oxygen 17 possibly also being incorporated in the layer 20 forming. To form the layer, the substrate 13 may be moved back and forth in the direction of the double-headed arrow 21 in front of the cold gas spray gun 12. During this coating process, the vacuum in the vacuum chamber 11 is constantly maintained by a vacuum pump 22, the process gas being passed through a filter 23 before it is conducted through the vacuum pump 22, in order to filter out particles that have not been bonded to the surface 16 when they impinged on it.

The particles 19 may be additionally heated within the cold gas spray nozzle by means of a heater 23. This results in an additional introduction of energy, which is fed to the particle 19 directly as thermal energy or, by expansion in the Laval nozzle, in the form of kinetic energy. Installed in the vacuum chamber 11 as a further energy source is a laser 24, which is directed at the point of impingement of the cold jet on the surface 16 of the workpiece 13. At the point of impingement, the electromagnetic energy of the laser beam together with the kinetic and possibly thermal energy of the particles 19 have the effect of making the particles 19 permanently adhere on the surface 16, whereby the layer 20 is formed.

In FIG. 2, the energy $E_p$ to which the coating particles are subjected is graphically represented. This energy comprises the kinetic energy of the particles in the cold gas jet and a possible component attributable to thermal energy. It shows a range 26 that is used for the cold gas spraying method according to the prior art. The upper limit of this range is provided by the melting of the particles, which is not intended in cold gas spraying. Possible incipient melting of the particle surface may perhaps be acceptable. The lower limit of the range is provided by the particles no longer adhering to the surface that is to be coated, but flying off again (cf. FIG. 3), when the energy $E_p$ falls below a certain amount. It also shows, by shading, a range 27, which comprises suitability for carrying out the method according to the invention. This range overlaps with the lower part of the range 26. The upper limit of the range 27 is provided by the energy $E_p$ becoming too great to ensure temporary adherence of the particles on the surface that is to be coated, i.e. to include the possibility of subsequent removal of the particles. The lower limit is defined by the power of the generator for electromagnetic radiation, since, together with the introduction of energy provided by the electromagnetic radiation, $E_p$ must be adequate to ensure the formation of a layer. As FIG. 2 clearly illustrates, the range for $E_p$ of the method according to the invention is shifted with respect to the cold gas spraying according to the prior art toward smaller amounts of energy.

FIG. 3 shows a single particle 19, the kinetic energy of which is not adequate to achieve at least temporary adherence on the surface 16 of the workpiece 13. It therefore rebounds from the surface 16, undergoing a resultant deformation. In FIG. 2, the process according to FIG. 3 is indicated by the range 27 outside of the range 26.

In FIG. 4, the particles 19 hit the surface 16 of the workpiece 13 with sufficient kinetic energy that temporary adherence is brought about. However, bonding of the particles 19 to the surface 16 is still weak, so that the particles 19 can be removed again from the surface 16. According to FIG. 2, the process according to FIG. 4 lies in the region where the ranges 27 and 26 overlap.

In FIG. 5 it is schematically illustrated how the laser beam 25 supplies individual particles 19 with a sufficient amount of energy that they fuse with the workpiece 13 to form a layer 20. This involves the formation of a new microstructure, which is indicated by grain boundaries 28.

The invention claimed is:

1. A method for coating a workpiece, which comprises the following method steps:
    accelerating particles of a coating material by way of a cold gas spray nozzle toward a surface of the workpiece to be coated;
    subjecting the particles in a cold gas jet to an amount of energy that is too small to cause permanent adherence of the particles on the surface of the workpiece, while setting the amount of energy in the cold gas jet great enough to cause temporary adherence of the particles;
    producing a permanent adherence of particles during coating by locally introducing electromagnetic radiation into a point of impingement where the cold gas jet impinges on the surface of the workpiece; and
    following the localized production of the permanent adherence of particles removing remaining, temporarily adhering particles from the surface.

2. The method according to claim 1, wherein the amount of energy in the cold gas jet is too small to cause any adherence of the particles on the surface of the workpiece, and the step of locally introducing the electromagnetic radiation for producing the permanent adherence is performed simultaneously with the impingement of the particles on the surface of the workpiece.

3. The method according to claim 1, which comprises subjecting the particles to an amount of energy comprised of an amount of kinetic energy, produced by an acceleration thereof in the cold gas spray nozzle, and of an amount of thermal energy, produced by way of an additional energy source in a cold gas jet issuing from the cold gas spray nozzle.

4. The method according to claim 1, which comprises providing a workpiece with an electrically insulating surface and forming electrically conductive strip conductors from the particles on the workpiece by way of the electromagnetic radiation.

5. The method according to claim 1, which comprises generating the electromagnetic radiation with a laser.

* * * * *